(12) United States Patent
Olson et al.

(10) Patent No.: US 11,039,224 B2
(45) Date of Patent: Jun. 15, 2021

(54) TELECOMMUNICATION APPLIANCE HAVING HIGH DENSITY EMBEDDED PLUGGABLE OPTICS

(71) Applicant: Infinera Corp., Annapolis Junction, MD (US)

(72) Inventors: Magnus Olson, Mountain View, CA (US); Jonas Viklund, Hägersten (SE); Erik Reinholdsson, Vällingby (SE); Einar In de Betou, Vällingby (SE)

(73) Assignee: Infinera Corporation, San Jose, CA (US)

( * ) Notice: Subject to any disclaimer, the term of this patent is extended or adjusted under 35 U.S.C. 154(b) by 70 days.

(21) Appl. No.: 16/116,580

(22) Filed: Aug. 29, 2018

(65) Prior Publication Data

US 2019/0208290 A1    Jul. 4, 2019

Related U.S. Application Data

(60) Provisional application No. 62/613,101, filed on Jan. 3, 2018.

(51) Int. Cl.
| | |
|---|---|
| *H04Q 1/04* | (2006.01) |
| *H05K 7/18* | (2006.01) |
| *H05K 7/20* | (2006.01) |
| *H05K 5/03* | (2006.01) |
| *H04Q 1/06* | (2006.01) |
| *H04Q 1/02* | (2006.01) |

(52) U.S. Cl.
CPC ........... *H04Q 1/04* (2013.01); *H04Q 1/023* (2013.01); *H04Q 1/06* (2013.01); *H04Q 1/13* (2013.01); *H05K 5/03* (2013.01); *H05K 7/186* (2013.01); *H05K 7/20136* (2013.01)

(58) Field of Classification Search
CPC ............ H04Q 1/04; H04Q 1/06; H05K 7/186; H05K 7/20136; H05K 5/03
See application file for complete search history.

(56) References Cited

U.S. PATENT DOCUMENTS

| | | | |
|---|---|---|---|
| 7,822,311 B2 | 10/2010 | Stansbury et al. | |
| 7,856,166 B2 | 12/2010 | Biribuze et al. | |
| 9,097,872 B2 | 8/2015 | Seo et al. | |

*Primary Examiner* — Rasha S Al Aubaidi
(74) *Attorney, Agent, or Firm* — Dunlap, Codding PC (57) ABSTRACT

A telecommunication appliance and method is described. In the method, a flexible cover part of an appliance cover of a telecommunication appliance supported by a telecommunication rack is removed while the telecommunication appliance is in service and passing data. The telecommunication appliance has a plurality of pluggable optical modules installed within connectors within a space encompassed by the appliance cover. The connectors are operably connected to a power supply supplying power to the connectors. When a first one of the connectors is devoid of a pluggable optical module being installed within the first one of the connectors, a first pluggable optical module is plugged into the first one of the connectors.

15 Claims, 6 Drawing Sheets

TELECOMMUNICATION APPLIANCE HAVING HIGH DENSITY EMBEDDED PLUGGABLE OPTICS

INCORPORATION BY REFERENCE

The entirety of the following patents and patent applications are hereby expressly incorporated herein by reference: provisional patent application Ser. No. 62/613,101, filed Jan. 3, 2018, entitled "Telco Operationalized Embedded Pluggable Optics."

FIELD OF THE DISCLOSURE

The disclosure generally relates to a telecommunication appliance that increases the density of pluggable optical modules within an appliance cover, and facilitates maintenance on the pluggable optical modules.

BACKGROUND

Telecommunication system circuit packs including pluggable module housings are deployed in various communication networks and are configured to allow for the hot insertion and hot removal of a variety of pluggable modules. Components that allow for hot insertion and hot removal are known as "hot-swappable." Hot-swappable components can be inserted and/or removed in the field without disassembling the host system, for example, while the host system is in use and/or without interrupting electrical power.

For example, pluggable optical modules used in telecommunication systems are typically hot swappable. Pluggable optical modules are generally plugged into a linecard by sliding or otherwise inserting the pluggable optical module into a housing of the linecard while the linecard continues to receive power. The pluggable optical modules may be positioned in the linecard vertically adjacent to one another and/or laterally adjacent to one another.

Within optical telecommunication systems, the pluggable optical modules are positioned within ports of telecommunication chasses that are arranged within standard-sized telecommunication racks. The ports are normally on the front and rarely on the back of the telecommunication chasses. These telecommunication systems provide large numbers of optical cable connections that join various types of network equipment. Examples of network equipment include electrically powered unit such as optical line terminals, optical network terminals, network interface devices, servers, splitters, combiners, multiplexers, switches and routers, fanout boxes and patch panels. This network equipment is also often installed within cabinets or data centers in standard-sized equipment racks.

Each piece of equipment typically provides one or more adapters where optical or electrical patch cables (jump cables') can be physically connected to the equipment. These patch cables are generally routed to other network equipment located in the same cabinet or in another cabinet.

A common problem in telecommunications systems, and in particular with optical telecommunications equipment, is space management. Current practice in telecommunications is to utilize standard electronics racks or frames that Support standards-sized stationary rack-mounted housings with widths of 19, 21, or 23 inches horizontal spacing. Vertical spacing has been divided into rack units "U", where 1U=1.75 inches as specified in EIA (Electronic Industries Alliance) 310-D. IEC (International Electrotechnical Commission) 60297 and DIN ("German Institute for Standardization") 41494 SC48D. The housings may be fixed, slide-out, or Swing-out patch/splice panels or shelves. However, the configurations and sizes of present-day housings for optical telecommunications equipment have been defined largely by the properties of the fiber optic cables that connect to the devices supported by the housings. In particular, the configurations and sizes have been established based on the particular ability of the fiber optic cables and optical fibers therein to interface with the devices without exceeding the bending tolerance of the fiber optic cable and/or the optical fibers.

Pluggable optical modules are often used to interconnect switching and computer appliances which are stacked in telecommunication cabinets. In dense environments or under site constraint conditions, such as central offices in telecommunication networks, hub sites in cable television networks, and data center environments, there is a constant push to increase the number of optical modules per rack unit. In today's state-of-the art data communication appliances the number of pluggable optical modules are limited by the frontplate area of an appliance into which the optical modules are plugged. The appliance in turn, is provided with other appliances A cabinet may include multiple shelves.

One solution to space management has been the concept of placing the optical modules within the housings of the appliances. This practice is known in the art as embedding the optical modules within the housings, also referred to as board mounted optics. This solution has a maintenance drawback due to the fact that pluggable optical modules can fail and need to be replaced. In telecommunication networks, maintenance operations of this type often have to be carried out without taking all of the optical modules within the housing out of service, limiting the network failure to the function depending on the failing optical module only. Replacing optical modules embedded within the housing has, conventionally, required that the appliance or card within the housing be powered down, be taken out of the rack mounting cabinet, the top cover be opened and the replacement carried out either on site or have the appliance completely replaced. If the data traffic supported by the appliance cannot be re-routed to a redundant system, the result is a network service outage during maintenance. In many network environments this cannot be accepted, limiting the interest for embedded optical modules in appliances.

Therefore, there exists a need for increasing the density of the optical modules and/or connections while permitting selective replacement of embedded optical modules without taking other optical modules out of service. The present disclosure addresses the operational challenges that arise when pluggable optical modules are embedded to appliances or telecommunications equipment to increase the density as measured by the number of pluggable optical modules per rack unit height supported by the telecommunication appliance.

SUMMARY

The mechanisms proposed in this disclosure circumvent the problems described above. Conventionally, telecommunication appliances mounted pluggable optical modules solely on the front of the telecommunication appliances thereby suffering from relatively low pluggable optical module densities. Conventional efforts to improve the density of the pluggable optical modules by disposing pluggable optical modules within the housing of the telecommunication appliance have suffered from numerous operational issues involving failure and replacement of the pluggable optical modules. The present disclosure solves the operational challenges of embedding a high number of pluggable optical modules into a telecommunication appliance that fits into a standard telecommunication cabinet, thereby allowing a greater optical module density per rack unit. The present disclosure enables maintenance of the pluggable optical modules while the telecommunication appliance is in service and in full operation by incorporating a maintenance mode in which power is provided to the pluggable optical modules, and to a fan encompassed by an appliance cover thereby allowing an operator of the telecommunication appliance to add, take out, or replace pluggable optical modules without taking the telecommunication appliance out of service. Further, examples of the telecommunication appliance of the present disclosure may segment a telecommunication equipment space encompassed by the appliance cover of the telecommunication appliance into a fixed space and one or more modular spaces to host pluggable optical modules. Pluggable optical modules are positioned within the telecommunication equipment space adjacent to the one or more modular spaces thereby allowing a greater density of pluggable optical modules within the telecommunication appliance. In some embodiments, the pluggable optical modules are positioned adjacent to and parallel with the sides of the appliance cover thereby increasing the number of pluggable optical modules that can be installed within the telecommunication appliance. Further, the telecommunication appliance may be movably mounted to the telecommunication rack to provide operator access to the pluggable optical modules along the sides of the appliance cover. In this example, slide mechanisms are provided to permit movement of the appliance cover, and a movable power mechanism is provided to secure power cord management to keep the power cord within the telecommunication appliance's allocated rack unit space when the telecommunication appliance is pulled out of the telecommunication rack for maintenance of the pluggable optical modules.

Further, the telecommunication appliance can be pre-configured with pluggable optical modules installed within first and/or second cages within the telecommunication appliance and with optical fibers connected between the pluggable optical modules and an access port on the front or rear of the appliance cover in accordance with customer supplied specifications. Then, the telecommunication appliance, in the pre-configured form, can be provided to a customer so that the customer does not have to install the pluggable optical modules, or configure the optical connections between the pluggable optical modules and the access port.

BRIEF DESCRIPTION OF THE DRAWINGS

Certain embodiments of the inventive concepts will hereafter be described with reference to the accompanying drawings, wherein like reference numerals denote like elements. It should be understood, however, that the accompanying figures illustrate the various implementations described herein and are not meant to limit the scope of the various technologies described herein.

DETAILED DESCRIPTION

The following detailed description refers to the accompanying drawings. The same reference numbers in different drawings may identify the same or similar elements.

The mechanisms proposed in this disclosure circumvent the problems described above. Conventionally, telecommunication appliances mounted pluggable optical modules solely on the front of the telecommunication appliances thereby suffering from relatively low pluggable optical module densities. Conventional efforts to improve the density of the pluggable optical modules by disposing pluggable optical modules within the housing of the telecommunication appliance have suffered from numerous operational issues involving failure and replacement of the pluggable optical modules. The present disclosure solves the operational challenges of embedding a high number of pluggable optical modules into a telecommunication appliance that fits into a standard telecommunication cabinet, thereby allowing a greater optical module density per rack unit. The present disclosure enables maintenance of the pluggable optical modules while the telecommunication appliance is in service and in full operation by incorporating a maintenance mode in which power is provided to the pluggable optical modules, and to a fan encompassed by an appliance cover thereby allowing an operator of the telecommunication appliance to add, take out, or replace pluggable optical modules without taking the telecommunication appliance out of service. Further, examples of the telecommunication appliance of the present disclosure may segment a telecommunication equipment space encompassed by the appliance cover of the telecommunication appliance into a fixed space and one or more modular spaces to host pluggable optical modules. Pluggable optical modules are positioned within the telecommunication equipment space adjacent to the one or more modular spaces thereby allowing a greater density of pluggable optical modules within the telecommunication appliance. In some embodiments, the pluggable optical modules are positioned adjacent to and parallel with the sides of the appliance cover thereby increasing the number of pluggable optical modules that can be installed within the telecommunication appliance. Further, the telecommunication appliance may be movably mounted to the telecommunication rack to provide operator access to the pluggable optical modules along the sides of the appliance cover. In this example, slide mechanisms are provided to permit movement of the appliance cover, and a movable power mechanism is provided to secure power cord management to keep the power cord within the telecommunication appliance's allocated rack unit space when the telecommunication appliance is pulled out of the telecommunication rack for maintenance of the pluggable optical modules.

DEFINITIONS

If used throughout the description and the drawings, the following short terms have the following meanings unless otherwise stated:

A pluggable optical module (or optical module) is a mechanical field replaceable unit that hosts control logic and laser transmitter(s) and receiver(s) for wavelength or gray optical transmission. Nonexclusive examples of pluggable optical modules are known in the art as a "Small Form-factor Pluggable (SFP) that is a compact, hot-pluggable optical module transceiver used for both telecommunications and data communications applications; enhanced small form-factor pluggable (SFP+) is an enhanced version of the SFP that supports data rates up to 16 Gbit/s; 10 Gigabit Small Form Factor Pluggable (XFP) is a standard for transceivers for high-speed computer network and telecommunication links that use optical fiber; and Quad Small Form-factor Pluggable (QSFP) is a compact, hot-pluggable transceiver used for data communications applications.

DESCRIPTION

Specific embodiments of the inventive concepts disclosed herein will now be described in detail with reference to the accompanying drawings. Further, in the following detailed description of embodiments of the present disclosure, numerous specific details are set forth in order to provide a more thorough understanding of the disclosure. However, it will be apparent to one of ordinary skill in the art that the embodiments disclosed herein may be practiced without these specific details. In other instances, well-known features have not been described in detail to avoid unnecessarily complicating the description.

Unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or at least one and the singular also includes the plural unless otherwise stated.

The terminology and phraseology used herein is for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited or inherently present therein.

As used herein any references to "one embodiment," "an embodiment," or "some embodiments" means that a particular element, feature, structure, or characteristic described in connection with the embodiment is included in at least one embodiment. The appearances of the phrase "in one embodiment" in various places in the specification may not refer to the same embodiment.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

Figure 1:
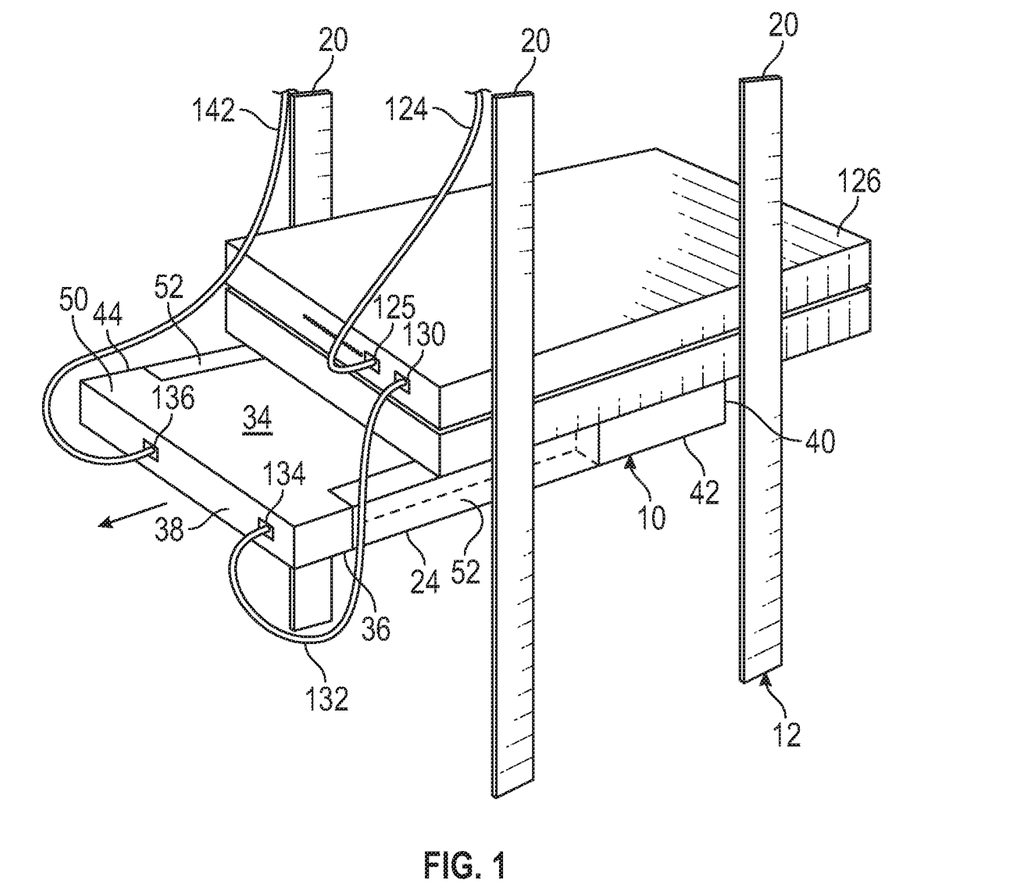
FIG. 1 is a frontal and side perspective view of an exemplary appliance constructed in accordance with the present disclosure mounted within a telecommunication rack.
Figure 2:
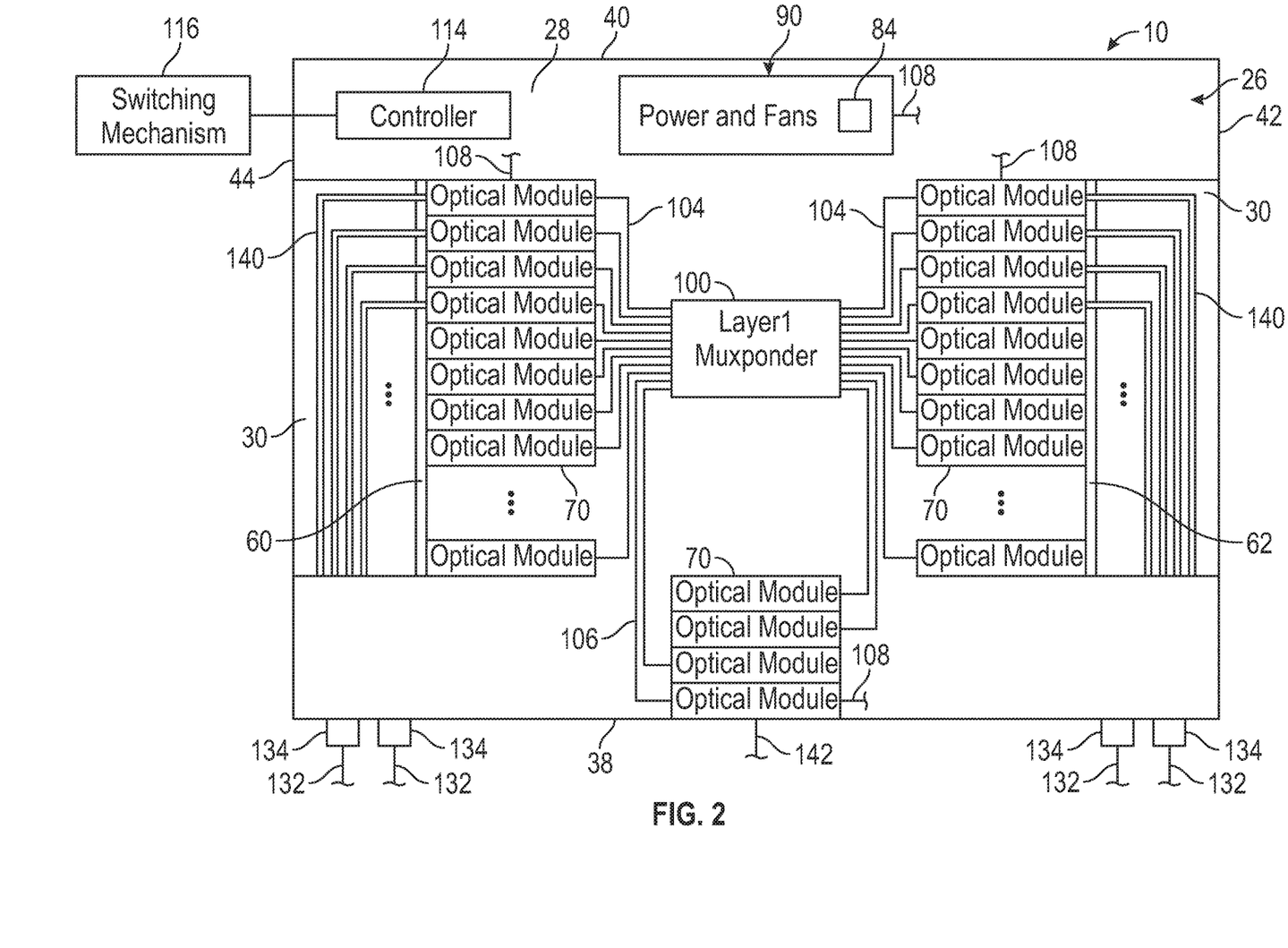
FIG. 2 is a top plan, schematic view of one version of the appliance of FIG. 1.
Figure 3:
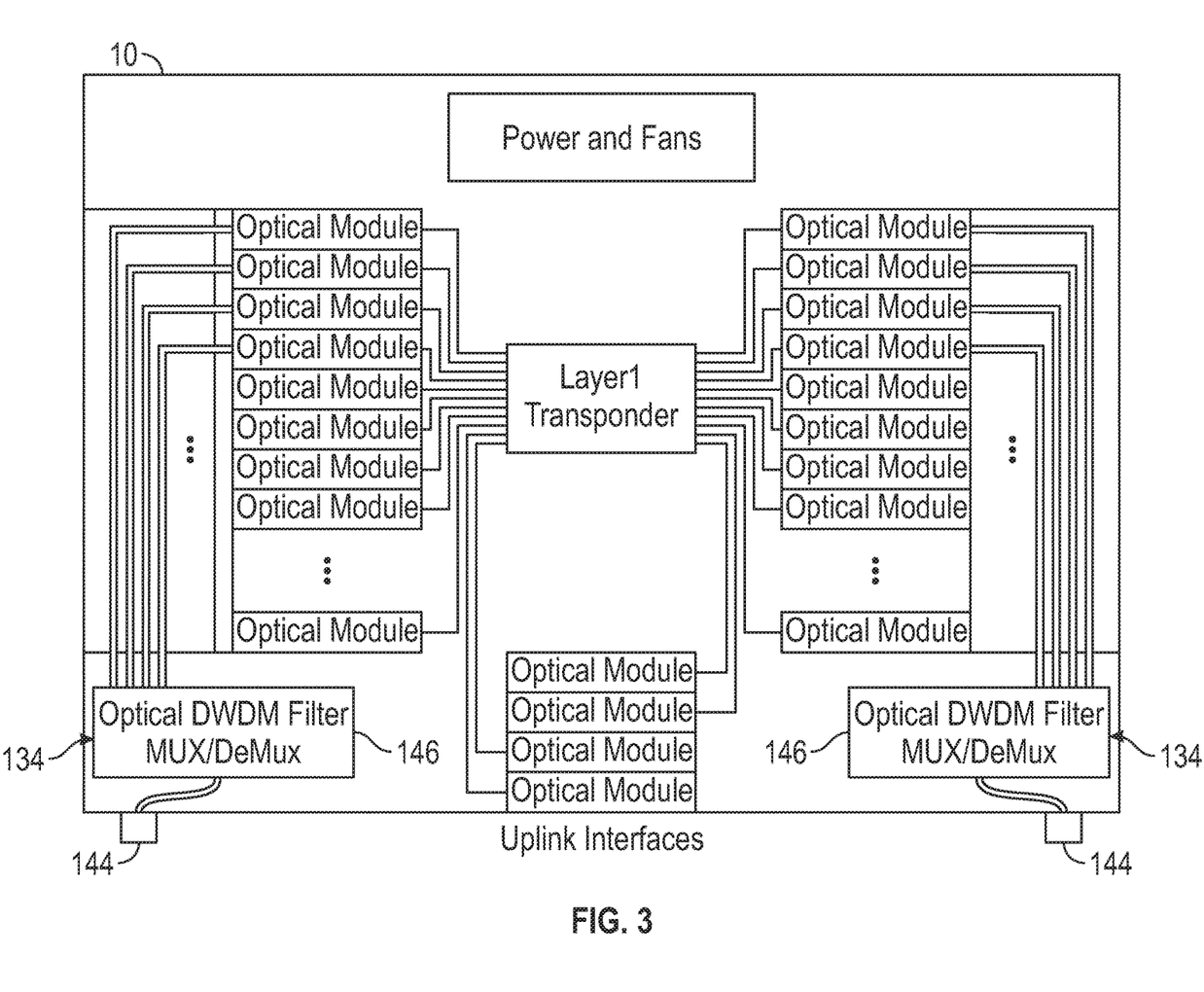
FIG. 3 is a top plan, schematic view of another version of the appliance of FIG. 1

Referring now to the drawings, and in particular to FIGS. 1-3, shown therein and designated by reference numeral 10 is a telecommunication appliance constructed in accordance with the present disclosure. The telecommunication appliance 10 is mounted within a telecommunication rack 12. According to one example, the telecommunication appliance 10 may be configured to fit a 19-inch four-post rack. The telecommunication appliance 10 may be configured to fit racks of other sizes. Also, as known in the telecommunications industry, the telecommunication rack 12 may come in different depths. As will be described in further detail below, the depth of the telecommunication appliance 10 can be adjusted to be used with the telecommunications rack 12 having different depths. According to one embodiment, the telecommunication appliance 10 occupies 1 standard rack units (RU) of rack space. Other sizes for the telecommunication appliance 10 are certainly possible. For example, the telecommunication appliance 10 may occupy two standard rack units of rack space within the telecommunications rack 12.

Figure 4:
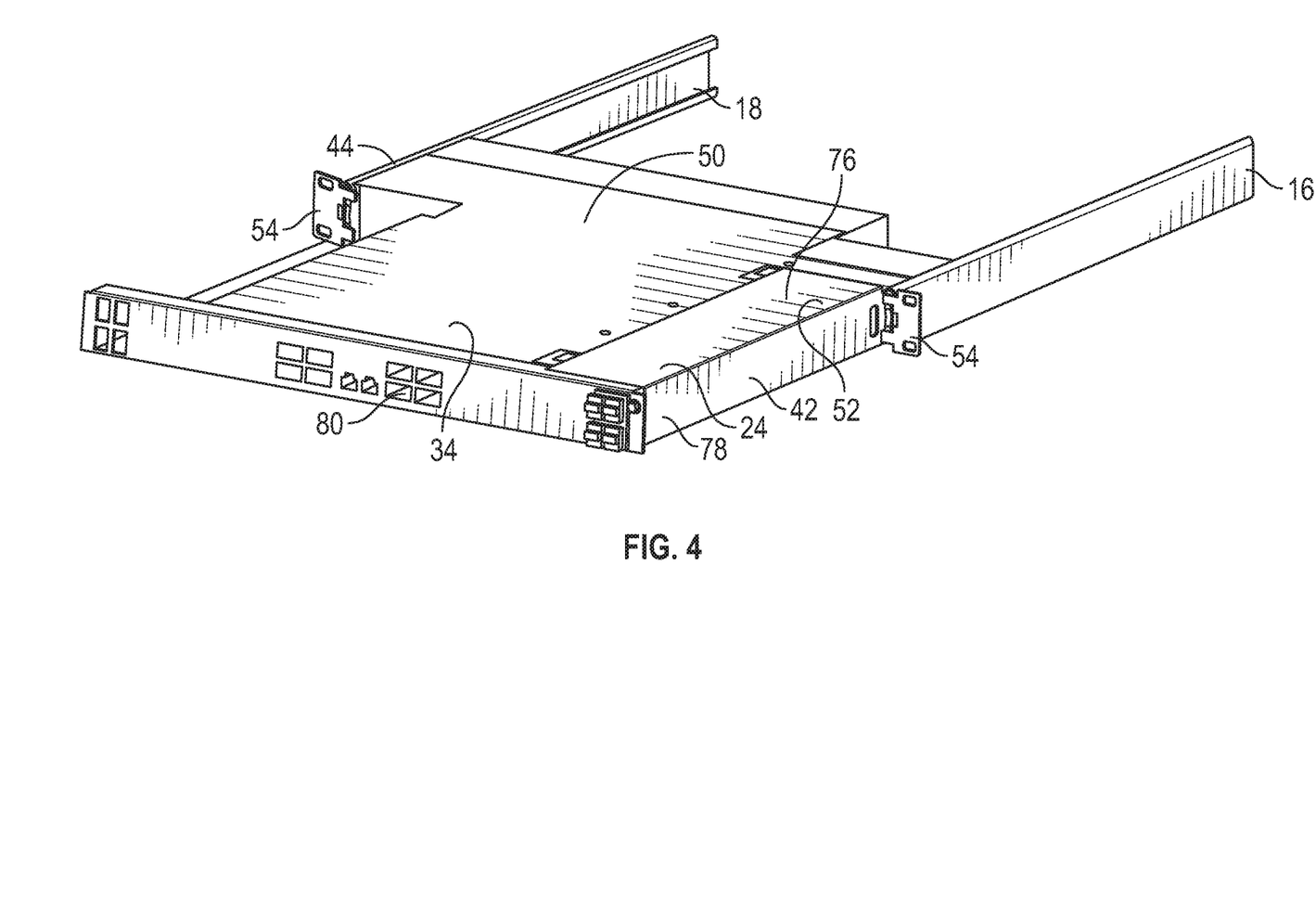
FIG. 4 is a frontal and side perspective view of the appliance depicted in FIG. 1.

As shown in FIGS. 1 and 4, the telecommunication appliance 10 may be movably connected to the telecommunications rack 12. For example, the telecommunication appliance 10 may be provided with a plurality of slide mechanisms 16 and 18 connected to the telecommunications rack 12 to permit the telecommunication appliance 10 to function as a drawer-type, pullout appliance. More particularly, the telecommunications rack 12 may be provided with a plurality of vertical supports 20 that are spaced apart to define a plurality of rack units. Although the size of the telecommunications rack 12 may vary, in some examples, the telecommunications rack 12 may define 42 rack units. A standard size of the rack unit is 44.45 mm in height.

The telecommunication appliance 10 includes an appliance cover 24 encompassing a telecommunication equipment space 26 sectioned into a fixed space 28 and at least one modular space 30. In the example shown, the telecommunication equipment space 26 is sectioned into one fixed space 28, and two modular spaces 30. In this example, the fixed space 28 is in between the two modular spaces 30, and houses boards including a CPU, ASICs for control, compute, management and data traffic forwarding, regardless of whether or not the telecommunication appliance 10 is in a normal or maintenance mode of operation (as discussed below). In the example shown, the appliance cover 24 has at least one of a top 34, and a bottom 36. The appliance cover 24 also has a front 38, a rear 40, a first side 42 and a second side 44. The appliance cover 24 is sized to fit within the telecommunication rack 12. As will be described in more detail below, the appliance cover 24 includes at least one fixed cover part 50 extending about the fixed space 28, and at least one flexible cover part 52 extending about the modular space 30. In the example shown, the appliance cover 24 is provided with two flexible cover parts 52 extending about the modular spaces 30. The flexible cover parts 52 may be removed to provide access to the modular spaces 30, as will be discussed in more detail below.

As best shown in FIG. 4, the slide mechanisms 16 and 18 are connected to the appliance cover 24 with any suitable fastener, such as screws (not shown). The slide mechanisms 16 and 18 are also connected to the vertical supports 20 of the telecommunication rack 12 with flanges 54, and any suitable fasteners, such as screws (not shown) so as to allow the telecommunication appliance 10 to be slidably moved into and out of the telecommunication rack 12 in a linear fashion. In the example shown, the slide mechanism 16 is connected to the first side 42 of the appliance cover 24, and the slide mechanism 18 is connected to the second side 44 of the appliance cover 24.

Figure 5:
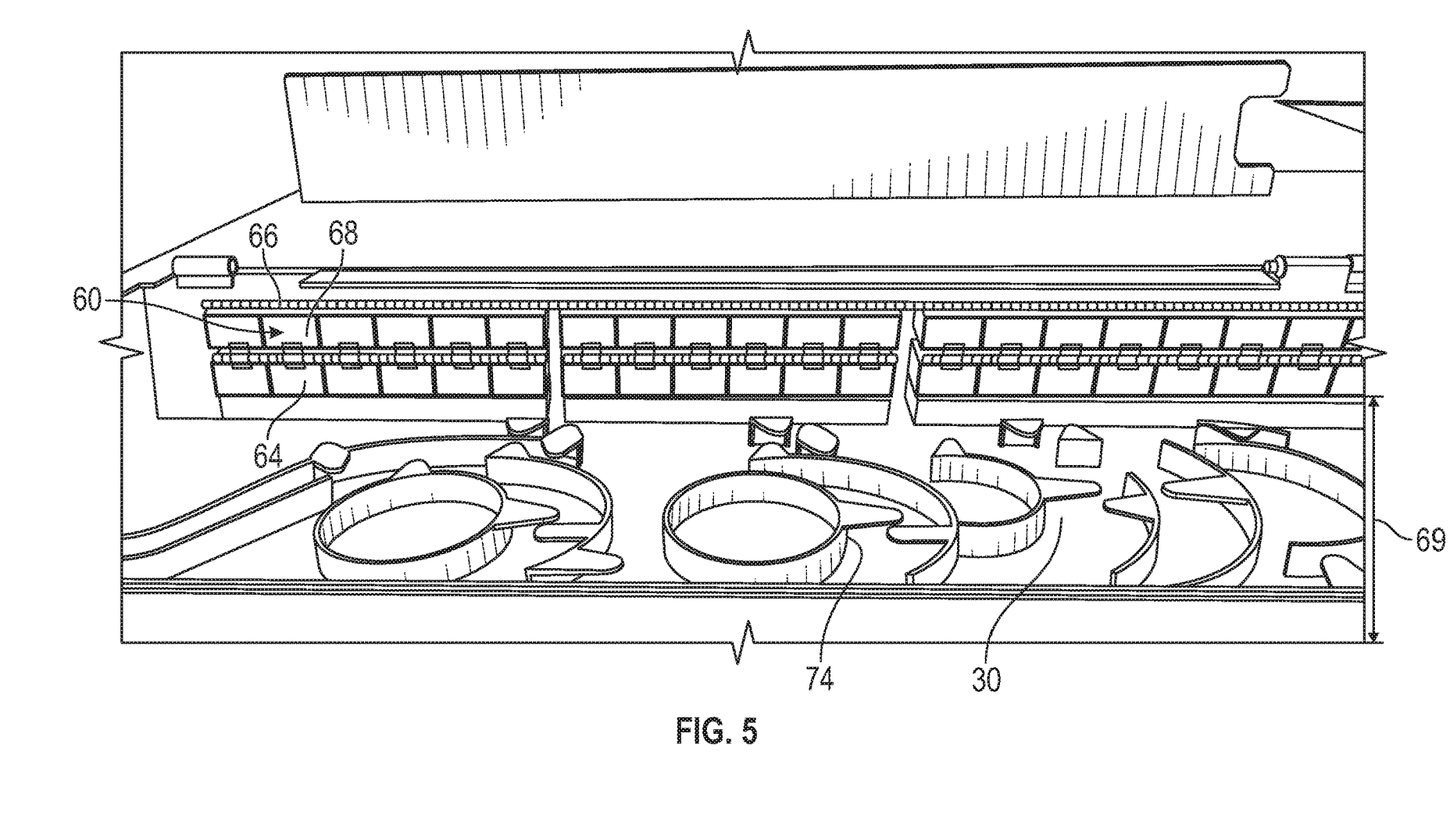
FIG. 5 is a side perspective view of the appliance of FIG. 1 having a side cover and a top cover of a flexible cover part of the appliance removed to show internal fiber management and a cage to receive pluggable optical modules, in accordance with the present disclosure.

As shown in FIG. 2 and FIG. 5, a first cage 60 and a second cage 62 are positioned within the telecommunication equipment space 26. The first and second cages 60 and 62 may be identical in construction and function. Thus, for purposes of brevity, only the first cage 60 will be described herein. The first cage 60 includes a plurality of vertical supports 64 and a plurality of horizontal supports 66 positioned in a grid-like pattern forming a plurality of first connectors 68 sized and dimensioned to attach to pluggable optical modules 70 (see FIG. 3). As shown in FIG. 5, the first cage 60 is spaced a predetermined distance 69 from the second side 44 of the appliance cover 24. Further, in some embodiments, the first cage 60 is positioned in parallel with the second side 44 of the appliance cover 24.

The first connectors 68 may be arranged in a side-by-side fashion forming rows and columns. In the example shown, the first cage 60 has 22 vertical supports 64 and 3 horizontal supports 66 that form two rows and 20 columns of first connectors 68. In this example, the first cage 60 is designed to provide 40 first connectors 68, although the number of first connectors 68 can vary. The first connectors 68 are adjacent to the modular space 30 so that the pluggable optical modules 70 can be passed through the modular space 30 and inserted into the respective ones of the first connectors 68. The first connectors 68 are configured to work with certain types of pluggable optical modules 70. In general, pluggable optical modules 70 are transceivers that are available with a variety of transceiver (e.g., transmitter and receiver) specifications, allowing users to select the appropriate transceiver for each link to provide the required optical reach over the available optical fiber type (e.g. multi-mode fiber or single-mode fiber). Transceivers of the pluggable optical modules 70 are also designated by their transmission speed such as 2 Gb/second, 4 Gb/second, and 8 Gb/second.

The telecommunication appliance 10 is also provided with internal fiber management guides 74 positioned within the modular space 30. The internal fiber management guides 74, in some embodiments, include a plurality of curved members 76 positioned adjacent to one another. The size and/or curve of the curve member 76 are designed so as to facilitate bending of optical fibers without damaging such optical fibers. The internal fiber management guides 74 are positioned adjacent to the first cage 60. As shown in FIG. 4, the flexible cover part 52 includes a top cover 76, and a side cover 78. In the example shown, the top cover 76 is connected to the side cover 78. For example, the top cover 76 and the side cover 78 may be formed of a single piece of sheet metal that has been bent at 90 degrees. The top cover 76 forms a part of the top 34 of the appliance cover 24, and the side cover 78 forms a part of the first side 42 of the appliance cover 24.

The telecommunication appliance 10 is also provided with at least one second connector 80 on at least one of the front 38 or rear 40 of the appliance cover 24. In the example shown in FIG. 4, the telecommunication appliance 10 is provided with eight second connectors 80 arranged in two groups of four second connectors 80 on the front 38 of the appliance cover 24 separated by two RJ45 connectors in between. However, it should be understood that the number of second connectors 80 can vary.

As shown in FIG. 2, the telecommunication appliance 10 is also provided with at least one fan 84 for cooling components within the appliance cover 24. The fan 84 may be constructed in a variety of manners. For example, the fan 84 may have an impeller, or a non-impeller mechanism configured to produce a current of air into the fixed space 28. An example of a non-impeller mechanism is an electrostatic fluid accelerator. An electrostatic fluid accelerator is a device which pumps a fluid such as air without any moving parts. Rather, the electrostatic fluid accelerator uses a coulomb force from a high-voltage electric field to accelerate electrically charged air molecules.

The telecommunication appliance 10 is also provided with a circuit 90 (positioned on one or more circuit boards) positioned within the fixed space 28 and within the current of air produced by the fan 84. In some embodiments, the circuit 90 includes a switch 100, first leads 104 connecting the switch 100 to the first connectors 68 and second leads 106 connecting the switch 100 to the second connector 80, and third leads 108 providing power to the first connectors 68 and the second connector 80. The switch 100 can be a layer 2 switch, a layer 1 muxponder or transponder. For purposes of clarity, not all of the first leads 104, second leads 106 and third leads 108 are labeled. The circuit 90 also includes a controller 114 having a normal mode and a maintenance mode as will be described in more detail below. In general, the normal mode is designed to facilitate normal operation of the telecommunication appliance 10 in which power is provided to the circuitry 90, the first and second connectors 68, and 80, and the pluggable optical modules 70. When the flexible cover parts 52 are open or about to be open, a signal is sent to the controller 114 to switch the mode of the controller 114 from the normal mode to the maintenance mode. This can be done by utilizing a switching mechanism 116 in communication with the controller 114, such as a switch to detect movement of the appliance cover 24 out of the telecommunication rack 12, a switch to detect the opening of one or more of the flexible cover parts 52, a button to be pressed by the operator, a touch screen display or combinations thereof.

In accordance with the present disclosure, the components of the controller 114 and/or the circuitry 90 may include analog and/or digital components, or one or more suitably programmed microprocessor and associated hardware and software, or hardwired logic. Also, certain portions of the implementations may be described as "components" that perform one or more functions. The term "component," may include hardware, such as a processor, an application specific integrated circuit (ASIC), or a field programmable gate array (FPGA), or a combination of hardware and software. Software includes one or more computer executable instructions that when executed by one or more component cause the component to perform a specified function. It should be understood that the algorithms described herein are stored on one or more non-transitory memory. Exemplary non-transitory memory includes random access memory, read only memory, flash memory or the like. Such non-transitory memory can be electrically based or optically based.

When the controller 114 is in the maintenance mode, the parts under the fixed cover part 50 continue to be cooled as under normal operation. When a flexible cover part 52 is open, as shown in FIGS. 4 and 5, both the top cover 76 and the side cover 78 may be moved to provide access to the pluggable optical modules 70.

The maintenance mode is designed to facilitate maintenance on certain of the pluggable optical modules 70, without turning the telecommunication appliance 10 off, or otherwise interfering with the operation of the circuitry 90, the first connectors 68, the second connectors 80, or the pluggable optical modules 70 upon which maintenance is not being performed. In one embodiment, the controller 114 enables the fan 84 to produce the current of air, and supplies electrical power to the third leads 108 when the controller 114 is in the maintenance mode. In some embodiments, the fan 84 is configured to produce the current of air at a first level in the normal mode, and a second level in the maintenance mode. During maintenance, the flexible cover parts 52 may be removed from the appliance cover 24. In general, this can disrupt the ability of the current of air produced by the fan 84 to cool components within the telecommunication equipment space 26. To provide additional cooling when the flexible cover parts 52 are removed, the second level of the current of air is greater than the first level thereby providing more air to the components to facilitate cooling.

Returning to FIG. 1, shown therein is an exemplary implementation of a telecommunication system 120 including the telecommunication appliance 10. The telecommunication system 120 includes a first fiber bundle cable 124 carrying traffic and/or information from an access side of a telecommunication network. The first fiber bundle 124 may be connected to a first port 125 of an optional telecommunication device 126 such as a filter, patch panel, or switch. The telecommunication device 126 is also provided with a second output port 130 connected to a second fiber bundle cable 132. The first and second ports 125 and 130 may be bi-directional ports. The telecommunication appliance 10 is provided with at least one access port 134, and at least one uplink port 136. The second fiber bundle cable 132 is connected to the access port 134 so as to supply the traffic and/or information from the access side of the telecommunication network into the access port 134. In one embodiment, the access port 134 can be a multi-fiber optical adapter configured to connect to the various optical fibers within the second fiber bundle cable 132. In some embodiments, the access port 134 may be a multi-fiber push on connector to multiplex the fibers into chunks or groups of combined fibers to reduce the number of fibers that have to be managed on the front of the telecommunication appliance 10.

As best shown in FIG. 2, the telecommunication appliance 10 includes a plurality of pluggable optical modules 70 connected to the first connectors 68, and adjacent to the modular space 30. In this example, the telecommunication appliance 10 includes two modular spaces 30, with one of the modular spaces 30 being located on the first side 42, and the other one of the modular spaces 30 being located on the second side 44. In this example, the telecommunication appliance 10 is also provided with the first cage 60 and the second cage 62 supporting the first connectors 68 as well as the pluggable optical modules 70. This example also includes 8 access ports 134, with four of the access ports 134 being located adjacent to a first one of the modular spaces 30, and four of the access ports 134 being located adjacent to a second one of the modular spaces 30.

All of the access ports 134 are similar in construction and function. For purposes of brevity, only one of the access ports 134 will be described herein. When the access port 134 is a multi-fiber optical adapter, the access port 134 is configured to connect particular optical fibers within the second fiber bundle cable 132 to particular ones of the pluggable optical modules 70 with optical fiber connections 140. The pluggable optical modules 70 convert the traffic and/or information within the optical signals into electrical signals, and convey the electrical signals to the switch 100 via the first connector 68 and the first leads 104. The switch 100 multiplexes the traffic and/or information, and outputs the multiplexed signals via the second leads 106 to the second connectors 80. The second connectors 80 may be connected to pluggable optical modules 70 that are configured to be the uplink port(s) 136. The uplink ports 136 are connected to an uplink fiber 142 carrying traffic and/or information towards a core of the telecommunication network.

Shown in FIG. 3 is another version of the telecommunication appliance 10, that is identical to the version shown in FIG. 2, with the exception that the telecommunication appliance 10 of FIG. 3 is designed to communicate traffic and/or information with the access side of the telecommunication network in a dense wavelength division multiplexing format (DWDM). As known in the art, DWDM is a fiber optic transmission technique that employs light wavelengths to transmit data parallel by bit or serial by character. The access port 134 of the telecommunication appliance 10 depicted in FIG. 3 includes an optical adapter 144 with a DWDM line interface, and an optical DWDM filter Mux/Demux 146.

Figure 6:
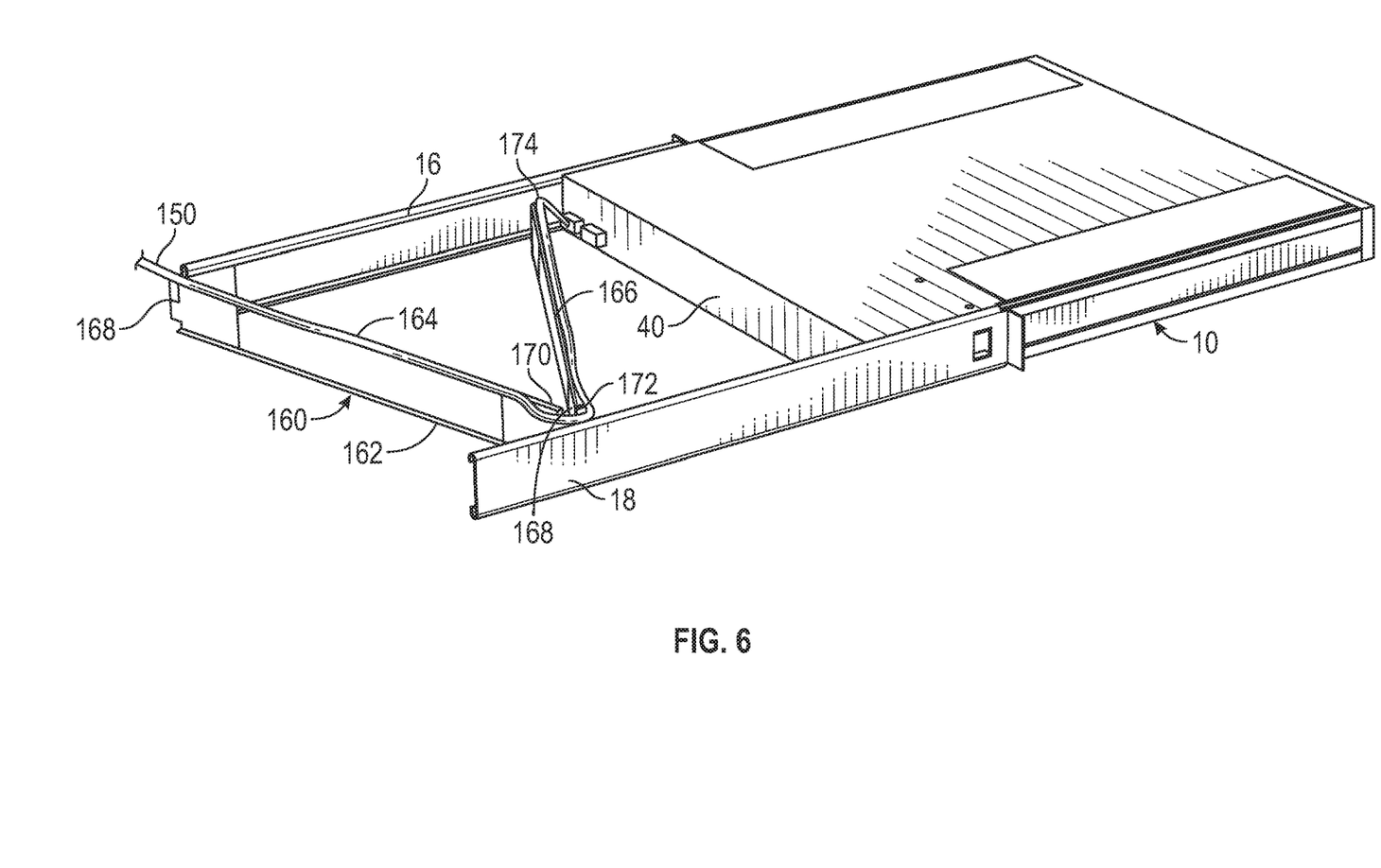
FIG. 6 is a rear top perspective view of the appliance of FIG. 1 showing a power cord for the appliance as well as exemplary power cord handling via a flexible arm of the appliance so that the power cord remains within a rack unit space allocated for the appliance.

Referring to FIG. 6, the telecommunication appliance 10 is also provided with a power cord 150. To allow the power cord 150 to move with the appliance cover 24 in the maintenance mode, the telecommunication appliance 10 also includes a power cord handling mechanism 160. In the embodiment shown, the power cord handling mechanism 160 includes a flexible arm 162 that connects to the power cord 150 and maintains the power cord 150 in the rack unit space allocated for the telecommunication appliance 10. The flexible arm 162 connects to and is positioned between the slide mechanisms 16 and 18. In one embodiment, the flexible arm 162 is provided with a first member 164 and a second member 166. The first member 164 includes a first end 168 and a second end 170. The second member 166 includes a first end 172 and a second end 174. The first end 168 of the first member 164 is pivotally connected to the sliding mechanism 16. The second end 170 of the first member 164 is pivotally connected to the first end 172 of the second member 166 to form a junction 168. The power cord 150 is supported by the first and second members 164 and 166 at various positions along the lengths of the first and second members 164 and 166. For example, the power cord 150 can be connected to the first member 164 at the first and second ends 168 and 170, and connected to the second member 166 at the second end 174. The power cord handling mechanism 160 may be implemented in other ways.

CONCLUSION

Due to the fact that the pluggable optical modules 70 can fail and need to be replaced, in telecommunication networks, maintenance operations of this type had to be carried out without taking the appliance out of service, limiting the network failure to the function depending on the failing unit only. Replacing pluggable optical modules embedded to an appliance has, conventionally, required that the appliance or card be powered down, be taken out of the rack mounting cabinet, the top cover be opened and the replacement carried out either on site or have the appliance or card completely replaced. If the data traffic supported by the appliance cannot be re-routed to a redundant system, the result is a network service outage during maintenance. In many network environments this cannot be accepted, limiting the interest for embedded optics in conventional telecommunication appliances.

To solve the main objective to support maintenance while in operation, a number of follow on operational objectives are provided: the telecommunication appliance 10 is preferably slid out to 'maintenance mode' to allow access to the pluggable optical modules 70 with power and fiber connectors securely in place; the controller 114 switches to the 'maintenance mode' to provide cooling to the circuitry 90 including ASICs, CPUs and other electrical components of the circuitry 90, e.g., a main electrical board, when in maintenance mode; the modular spaces 30 between the pluggable optical modules 70 and the first side 42 or second side 44 are preferably provided to permit access to the pluggable optical modules 70 as is the case in front-mounted pluggable optics (such access permits an operator to replace the pluggable optical module); the first connectors 68 provide mechanical multiplexing of internal fibers to higher density fiber connectors.

To provide service to one or more of the pluggable optical modules 70 within the telecommunication appliance, the telecommunication appliance 10 is moved relative to the telecommunication rack 12 while power is being supplied to the first connectors 68 to provide access to the flexible cover part(s) 52 of the appliance cover 24 while the telecommunication appliance 10 is in service, passing data, and the first connectors 68 are receiving power from the power supply. As discussed above, the telecommunication appliance has a maintenance mode in which power is supplied to the first connectors 68 and the fan 84 supplies air to cool components within the telecommunication appliance 10. The telecommunication appliance 10 is switched to the maintenance mode and the flexible cover part 52 is removed to provide access to the pluggable optical modules 70 and the first connectors 68. Then, pluggable optical modules 70 can be added, removed or replaced as discussed above. For example, when a first one of the first connectors 68 is devoid of a pluggable optical module 70 being installed within the first one of the connectors, a first pluggable optical module 70 can be plugged within the first one of the first connectors 68.

The present disclosure also addresses the challenge of dense fiber management in conventionally designed space constrained embedded systems. To solve these problems, the telecommunication appliance 10 includes access ports 134 configured as having multiple fiber interfaces in the same connector to reduce the number of fibers that have to be managed on the front of conventional appliances.

Furthermore, the present disclosure also address the issue of internal fibers with the objective to allow an operator to add, delete or change the pluggable optical module 70 without changing the fiber structure inside the telecommunication appliance 10.

Consistent with the present disclosure, the sliding mechanisms 16 may be provided to slide the telecommunication appliance 10 from the telecommunication rack 12 and thereby place the telecommunication appliance 10 in the maintenance mode.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A telecommunication appliance, comprising:
   an appliance cover encompassing a telecommunication equipment space sectioned into a fixed space and a modular space, the appliance cover having at least one of a top, and a bottom, the appliance cover having a front, a rear, a first side and a second side, the appliance cover being sized to fit within a telecommunication rack, the appliance cover including at least one fixed cover part extending about the fixed space, and at least one flexible cover part extending about the modular space;
   a first cage positioned within the telecommunication equipment space, the first cage forming a plurality of first connectors sized and dimensioned to attach to pluggable optical modules, the first connectors adjacent to the modular space;
   a second connector on at least one of the front or rear of the appliance cover;
   a fan having at least one of an impeller and or a non-impeller mechanism configured to produce a current of air into the fixed space; and
   a circuit positioned within the fixed space and within the current of air produced by the fan, the circuit including a switch, first leads connecting the switch to the first connectors and second leads connecting the switch to the second connector, and third leads providing power to the first connectors and the second connector, the circuit including a controller having a maintenance mode in which the controller enables the fan to produce the current of air, and supplies electrical power to the third leads.

2. The telecommunication appliance of claim 1, wherein the first cage is spaced a predetermined distance from the first side of the appliance cover.

3. The telecommunication appliance of claim 2, wherein the first cage is positioned in parallel with the first side of the appliance cover.

4. The telecommunication appliance of claim 1, wherein the flexible cover part comprises a top cover and a side cover, the top cover being connected to the side cover, the top cover forming a part of the top of the appliance cover, and the side cover forming a part of the first side of the appliance cover.

5. The telecommunication appliance of claim 1, further comprising:
a group of pluggable optical modules with each of the pluggable optical modules in the group positioned within one of the first connectors;
an access port extending through the appliance cover, the access port having multiple fiber interfaces; and
a group of optical fibers with each optical fiber in the group being connected to one fiber interfaces of the access port, and one of the pluggable optical modules in the group of pluggable optical modules.

6. The telecommunication appliance of claim 1, wherein the first connectors are a first group of first connectors, the pluggable optical modules are a first group of pluggable optical modules, and the modular space is a first modular space, wherein the appliance cover encompasses a second modular space, and the telecommunication appliance further comprises:
a second cage positioned within the telecommunication equipment space, the second cage forming a second group of first connectors sized and dimensioned to attach to a second group of pluggable optical modules, the second group of first connectors adjacent to the second modular space; and
a second group of pluggable optical modules with each of the pluggable optical modules in the second group positioned within one of the first connectors in the second group;
an access port extending through the appliance cover, the access port having multiple fiber interfaces; and
a group of optical fibers with each optical fiber in the group being connected to one of the fiber interfaces of the access port, and one of the pluggable optical modules in the second group of pluggable optical modules.

7. The telecommunication appliance of claim 6, wherein the first cage is spaced a predetermined distance from the first side of the appliance cover, and the second cage is spaced a predetermined distance from the second side of the appliance cover.

8. The telecommunication appliance of claim 7, wherein the first cage is positioned in parallel with the first side of the appliance cover, and the second cage is positioned in parallel with the second side of the appliance cover.

9. The telecommunication appliance of claim 6, wherein the fixed space is positioned between the first cage and the second cage.

10. A telecommunication appliance, comprising:
an appliance cover encompassing a telecommunication equipment space sectioned into a fixed space between a first modular space, and a second modular space, the appliance cover having at least one of a top, and a bottom, the appliance cover having a front, a rear, a first side and a second side, the appliance cover being sized to fit within a telecommunication rack, the appliance cover including at least one fixed cover part extending about the fixed space, and a first flexible cover part extending about the first modular space and a second flexible cover part extending about the second modular space;
a first cage positioned within the telecommunication equipment space, the first cage having a first group of first connectors sized and dimensioned to attach to a first group of pluggable optical modules, the first group of first connectors adjacent to the first modular space;
a second cage positioned within the telecommunication equipment space, the second cage having a second group of first connectors sized and dimensioned to attach to a second group of pluggable optical modules, the second group of first connectors adjacent to the second modular space;
a second connector on at least one of the front or rear of the appliance cover;
a fan having at least one of an impeller and or a non-impeller mechanism configured to produce a current of air into the fixed space; and
a circuit positioned within the fixed space and within the current of air produced by the fan, the circuit including a switch, first leads connecting the switch to the first connectors, and second leads connecting the switch to the second connector, and third leads providing power to the first connectors, and the second connectors.

11. The telecommunication appliance of claim 10, wherein the first modular space is on the first side of the appliance cover, and the second modular space is on the second side of the appliance cover.

12. The telecommunication appliance of claim 10, wherein the first cage is positioned in parallel with the first side of the appliance cover.

13. The telecommunication appliance of claim 10, wherein the first flexible cover part comprises a top cover and a side cover, the top cover being connected to the side cover, the top cover forming a part of the top of the appliance cover, and the side cover forming a part of the first side of the appliance cover.

14. The telecommunication appliance of claim 10, further comprising:
a first group of pluggable optical modules with each of the pluggable optical modules in the first group positioned within one of the first connectors in the first group of first connectors;
an access port extending through the appliance cover, the access port having multiple fiber interfaces; and
a group of optical fibers with each optical fiber in the group being connected to one fiber interfaces of the access port, and one of the pluggable optical modules in the first group of pluggable optical modules.

15. The telecommunication appliance of claim 14, wherein the access port is a first access port, the fiber interfaces are first fiber interfaces, and the group of optical fibers is a first group of optical fibers, and wherein the telecommunication appliance further comprises:
a second group of pluggable optical modules with each of the pluggable optical modules in the second group positioned within one of the first connectors in the second group;
a second access port extending through the appliance cover, the second access port having multiple second fiber interfaces; and
a second group of optical fibers with each optical fiber in the second group being connected to one of the second fiber interfaces of the second access port, and one of the pluggable optical modules in the second group of pluggable optical modules.

* * * * *